United States Patent [19]
Millman et al.

[11] Patent Number: 5,406,216
[45] Date of Patent: Apr. 11, 1995

[54] TECHNIQUE AND METHOD FOR ASYNCHRONOUS SCAN DESIGN

[75] Inventors: Steven D. Millman; Thomas J. Balph, both of Mesa, Ariz.

[73] Assignee: Motorola, Inc., Schaumburg, Ill.

[21] Appl. No.: 158,557

[22] Filed: Nov. 29, 1993

[51] Int. Cl.⁶ .......................................... H03K 3/289
[52] U.S. Cl. ................................ 327/202; 327/107; 371/22.5; 371/22.3
[58] Field of Search ............ 307/272.1, 272.2; 328/137, 154; 370/91, 53; 371/22.5, 22.3; 327/107, 202, 217

[56] References Cited
U.S. PATENT DOCUMENTS 4,506,165  3/1985  Gulati et al. ................... 307/272.2

FOREIGN PATENT DOCUMENTS 4072583   3/1992  Japan .................................. 371/22.3
2218816  11/1989  United Kingdom ............... 371/22.3

OTHER PUBLICATIONS

Hollaar, "Direct Implementation of Asynchronous Control Units", IEEE Transactions on Computers, vol. C-31, No. 12, Dec. 1982, pp. 1133-1141.

Primary Examiner—Timothy P. Callahan
Assistant Examiner—Jung Ho Kim
Attorney, Agent, or Firm—Edward J. Mischen

[57] ABSTRACT

A novel RS latch for use in asynchronous designs has been provided. The RS latch is made scannable by the use of additional circuitry which provides a basis for a scan chain signal to propagate in and out the scannable RS latch. Such a scannable RS latch greatly facilitates the testing of the asynchronous design.

12 Claims, 5 Drawing Sheets

TECHNIQUE AND METHOD FOR ASYNCHRONOUS SCAN DESIGN

FIELD OF THE INVENTION

This invention relates to asynchronous designs and, in particular but not limited to, asynchronous designs having a scan chain for testing such asynchronous designs.

BACKGROUND OF THE INVENTION

A synchronous design is a design whose outputs can only change in response to a logic transition of a predetermined signal, for example, a clock signal. Using a scan technique to test a synchronous design has been readily used by the prior art. In general, testing a synchronous design using a scan chain involves modifying the flip-flops within synchronous designs to have two additional inputs: (a) a scan input and (b) a scan enable input such that when the scan enable input is active, and a positive edge occurs on the clock input of the flip-flop, the logic value appearing on the scan input is stored in the flip-flop. This procedure is continued until all flip-flops are stored with their respective desired logic values. Upon the next clocking of the flip-flops, the stored logic values from the flip-flops are applied to combination logic to test such combination logic. The result of applying the logic values to the combinational logic is then captured by a subsequent clocking of the flip-flops wherein these results may also be shifted out via a scan out signal. As a result, because flip-flops are already present in synchronous designs, synchronous designs are desirable because they are easy to test.

On the other hand, an asynchronous design is one whose inputs and outputs can change at any time. A major advantage of asynchronous design over synchronous designs is that asynchronous designs dissipate substantially less power than synchronous designs. This is so because asynchronous circuits only dissipate power when actively computing instead of on every clock cycle. And therefore, less power is consumed because there is less switching. However, asynchronous designs have been avoided because they are difficult to implement and difficult to test. Moreover, since asynchronous designs do not inherently include flip-flops, the above described scan chain technique for synchronous designs is not applicable.

Hence, there exists a need for a technique and method for testing asynchronous designs.

DETAILED DESCRIPTION OF THE DRAWINGS

Figure 1:
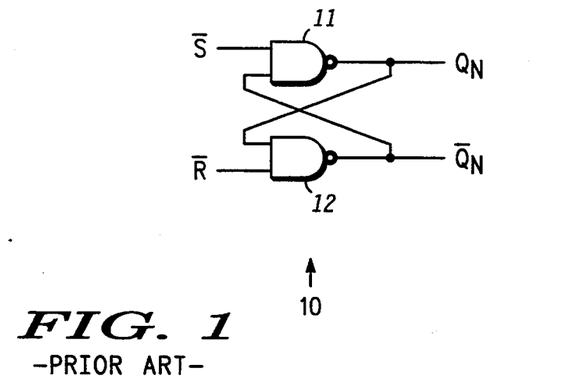
FIG. 1 illustrates a detailed logic diagram of a well known RS latch.

Referring to FIG. 1, a detailed logic diagram of a well known RS latch is shown. The RS latch includes NAND gates 11 and 12 having outputs for respectively providing outputs Q and $\bar{Q}$. NAND gate 11 has a first input coupled to receive set bar signal $\bar{S}$ and a second input coupled to the output of NAND gate 12. Further, NAND gate 12 has a first input coupled to receive reset bar signal $\bar{R}$ and a second input coupled to the output of NAND gate 11.

The operation of the RS latch shown in FIG. 1 can be concisely described by the truth table shown in table 1.

TABLE 1

| Truth Table for an RS latch. | | | |
|---|---|---|---|
| $\bar{R}$ | $\bar{S}$ | Q | $\bar{Q}$ |
| 0 | 1 | 0 | 1 |
| 1 | 0 | 1 | 0 |
| 0 | 0 | 1 | 1 |
| 1 | 1 | Q-1 | $\overline{Q\text{-}1}$ |

During normal operation, if signal $\bar{R}$ is a logic 0 and signal $\bar{S}$ is a logic 1, then the RS latch is reset and output Q is a logic 0 and output $\bar{Q}$ is a logic 1. However, if signal $\bar{R}$ is a logic 1 and signal $\bar{S}$ is a logic 0, then the RS latch is set and output Q is a logic 1 and output $\bar{Q}$ is a logic 0.

Moreover, during normal operation, it is not expected that signals $\bar{R}$ and $\bar{S}$ will both be a logic 0. However, if this does occur, both Q and $\bar{Q}$ will be a logic 1 until either signal $\bar{R}$ or signal $\bar{S}$ goes to a logic 1. Also, if both signal $\bar{R}$ and $\bar{S}$ are a logic 1, then outputs Q and $\bar{Q}$ will remain in their previous state.

Figure 2:
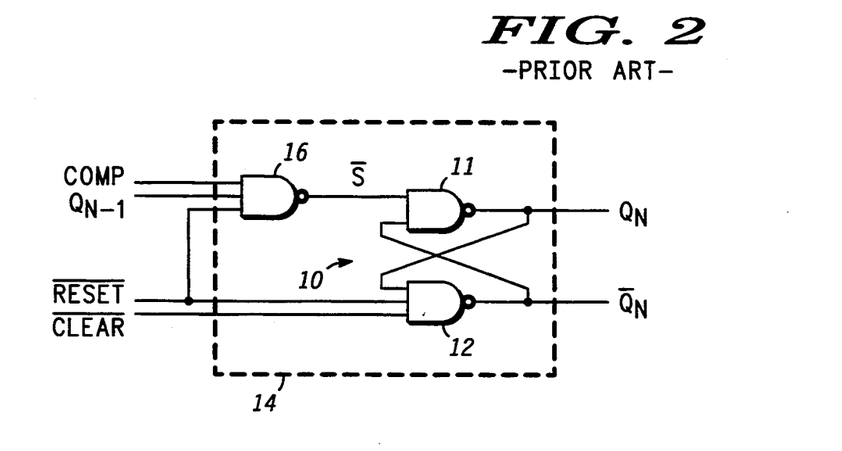
FIG. 2 is a detailed logic diagram illustrating a prior art RS latch being utilized in an asynchronous design building block.

Referring to FIG. 2, a detailed logic diagram of prior art asynchronous design building block 14 is shown. It is understood that components shown in FIG. 2 that are identical to components shown in FIG. 1 are identified by the same reference numbers. Asynchronous design building block 14 further includes NAND gate 16 having a first input coupled to receive completion signal COMP and a second input coupled to receive an output of a previous asynchronous design block similar to 14 as denoted by signal $Q_{N-1}$. Also, NAND gate 16 has a third input coupled to receive a reset bar signal as denoted by signal reset wherein this signal is also applied to a second input of NAND gate 12. In addition NAND gate 12 has a third input CLEAR coupled to receive an output signal $\bar{Q}_{N+1}$ of a succeeding asynchronous design building block similar to block 14.

Asynchronous design building block 14 is disclosed in an article entitled "Direct Implementation of Asynchronous Control Units" by Lee Hollaar, *IEEE Transactions on Computers*, vol. C-31, NO. 12, December 1982, the subject matter of which is incorporated by reference herein. Briefly, signal reset functions as an overriding clear function for RS latch 10. In normal operation, signal reset is high and thus inactive and RS latch 10 gets set only when signal $Q_{N-1}$ and signal COMP are both true wherein signal $Q_{N-1}$ is the active output state of a previous asynchronous design building block. Also, signal COMP is a logic signal indicating that whatever took place in the prior state has completed. Thus, assuming that signal reset is not active, the asynchronous state, for example state "N", represented by block 14 can only become active ($Q_N$=logic 1) when signal COMP is a logic 1 and its previous asynchronous state is active ($Q_{N-1}$=logic 1). The resetting of asynchronous state N is controlled by of course signal reset which represents a master reset for all the states. Further, as soon the next state is entered (state "N+1"), it is desired to leave the current state. Hence, the $\overline{Q}_{N+1}$ from the next state is fed back to state "N" to reset latch 11.

Figure 3:
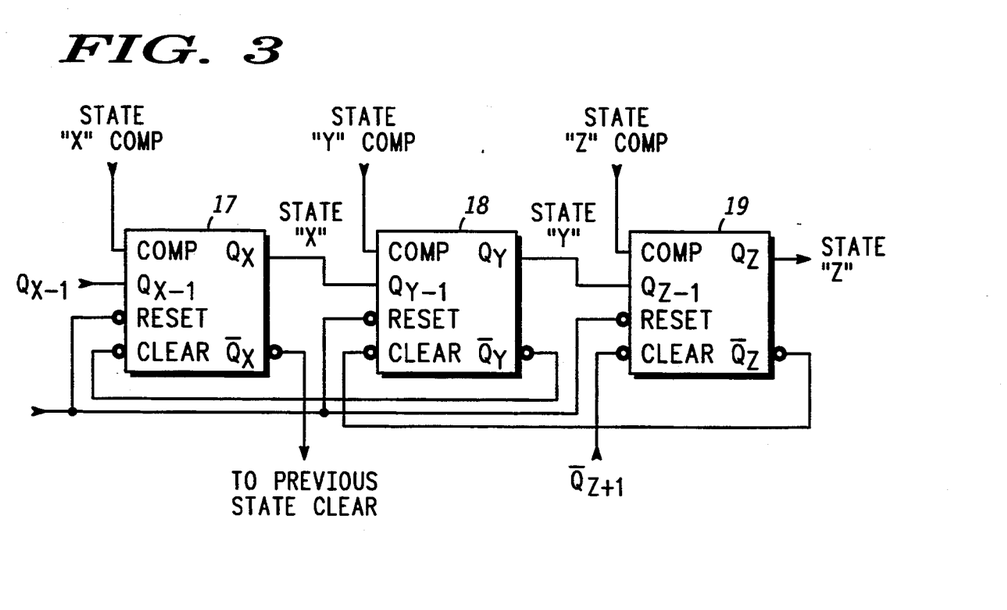
FIG. 3 is a detailed block diagram of a plurality of asynchronous design building blocks, similar to the one shown in FIG. 2, that are serially connected to implement a series of asynchronous states.

It is understood that a plurality of asynchronous design building blocks similar to block 14 can be serially connected to implement a series of asynchronous states as shown in FIG. 3. Blocks 17, 18 and 19 are blocks similar to block 14 shown in FIG. 2 wherein block 17 represents state "X", block 18 represents state "Y" and block 19 represents state "Z". In general, when the previous state to state "X" becomes active, then state "X"will go active when state "X" completion signal is a logic 1. That is, when certain conditions or requirements to enter state "X" are met and state "X−1" is active, then state "X" is entered. It is in this manner that asynchronous design building block 14 can be utilized to implement a series of sequential states. Moreover, it is understood that the series of states can be extended to any number of states although only three are shown for simplicity.

A significant problem with the above asynchronous state design is trying to adequately test the functionality of such state machine designs. Further, as aforementioned, such asynchronous designs have been avoided because they are difficult to design and even more difficult to test.

In response to this problem, the present invention provides a technique and method for testing such state machine designs by utilizing a scan technique. In particular, referring to FIG. 4, a detailed block diagram of a first embodiment of a scannable RS latch is shown. It is understood that components shown in FIG. 4 which are identical to components shown in FIG. 1 are identified by the same reference numbers. The RS scannable latch of FIG. 4 further includes multiplexer 30 having a first input coupled to receive a scan input signal (SCANIN) and a second input coupled to receive a set input signal (S) which is the inversion of the signal $\overline{S}$ applied at the first input of NAND gate 11.

Figure 4:
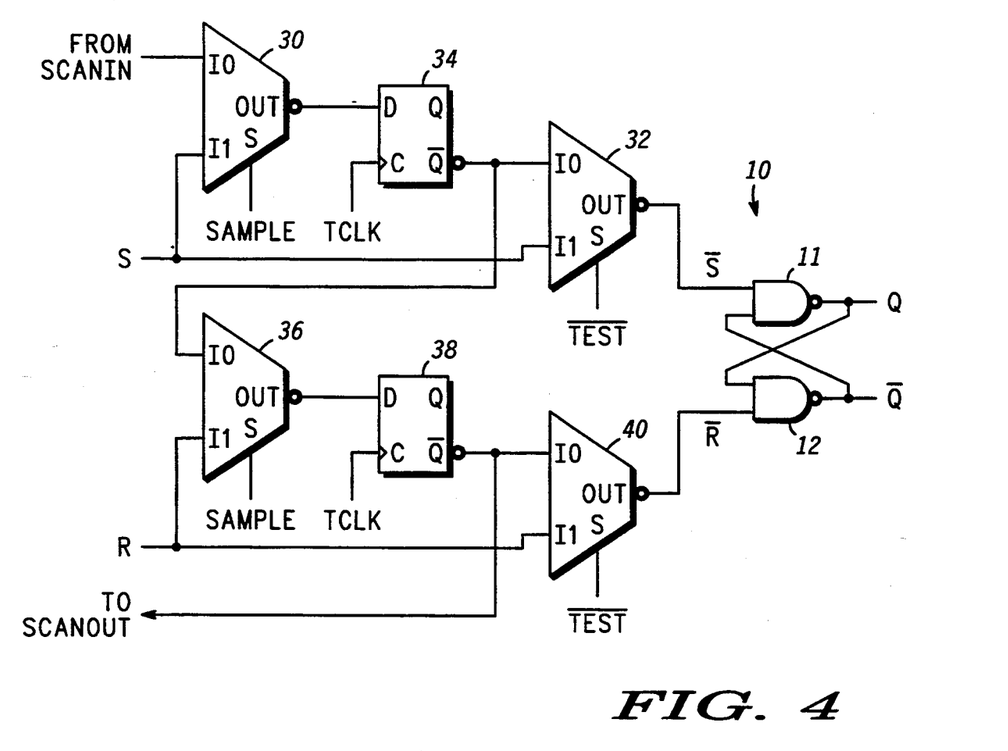
FIG. 4 is a detailed block diagram illustrating a first embodiment of a scannable RS latch in accordance with the present invention.

Set signal S is also applied to a second input of multiplexer 32. The output of multiplexer 30 is coupled to a data input of D-flip-flop 34 the latter of which has a clock input coupled to receive test clock signal TCLK. An inverting output of flip-flop 34 is coupled to a first input of multiplexer 32 and a first input of multiplexer 36. Multiplexer 36 has a second input coupled to receive a reset signal which is the inversion of signal $\overline{R}$ applied to the first input of NAND gate 12.

An output of multiplexer 36 is coupled to a data input of D-flip-flop 38 the latter of which has a clock input coupled to receive test clock signal TCLK. An inverting output of D-flip-flop 38 is coupled to a first input of multiplexer 40 and coupled to provide a scan output signal (SCANOUT). The second input of multiplexer 40 is coupled to receive reset signal R.

The select inputs of multiplexers 30 and 36 are coupled to receive sample control signal SAMPLE, while the select inputs of multiplexers 32 and 40 are coupled to receive test control signal TEST.

The outputs of multiplexers 32 and 40 respectively provide the $\overline{SET}$ and $\overline{RESET}$ signals to RS latch 10.

In normal operation, control signal TEST is a logic one whereby multiplexers 32 and 40 respectively pass input signals S and R via an inversion through multiplexers 32 and 40 to provide signals $\overline{S}$ and $\overline{R}$ to RS latch 10. In this normal operation mode, the RS scannable latch of FIG. 4 functions identically to the RS scannable latch 10 shown in FIG. 1 with the exception that the input signals are inverted in that signals S and R must be applied at the inputs of the scannable RS latch as opposed to signals $\overline{S}$ and $\overline{R}$.

However, when it is desired to test the functionality of RS latch 10, the additional circuitry shown in FIG. 4 allows for the use of a scan technique to provide predetermined known inputs to RS latch 10 for verifying its functionality.

The scan technique procedure for testing is done as follows.

Set control signal SAMPLE to a logic 0. This places flip-flop 34 and 38 into a scan chain.

Then set control signal TEST to a logic 1. This allows scanning to take place while being transparent to outputs Q and $\overline{Q}$ of RS latch 10. (Q and Q may change when test transitions but will not change in response to shifting of the scan chain.)

Now apply test clock signals via signal TCLK wherein the logic value applied at the first input of multiplexer 30 via signal SCANIN is appropriately set for each clock pulse. This has the effect of shifting in the required test pattern into flip-flops 34 and 38. Note that the final values applied to each RS latch should actively set or reset the latch. Thus, if signal $\overline{R}$ is a logic low then signal $\overline{S}$ should be a logic high and vice versa.

Now set control signal TEST to a logic 0. This applies the test pattern to RS latch 10.

Now set signal SAMPLE back to a logic 1. This takes flip-flops 34 and 38 out of the scan chain.

Now apply another clock pulse to signal TCLK thereby allowing the results of the test pattern to be read into the flip-flops 34 and 38 and other similar flip-flops.

Now set signal TEST to a logic 1. This again allows scanning to take place invisibly without effecting outputs Q and $\overline{Q}$ of RS latch 10. Note however, if signals S and R are different from the values just read, outputs Q and/or $\overline{Q}$ may change when signal TEST changes, but this will not change the test pattern that is scanned out via signal SCANOUT.

Now set control signal SAMPLE to a logic 0. This now places flip-flops 34 and 38 back into a scan chain.

Now apply clock pulses via signal TCLK to scan out the stored logic values in flip-flops 34 and 38 which were test results from the earlier predetermined SCANIN values. Moreover, if another pattern is desired to be used, one can simultaneously scan in the next set of test patterns via signal SCANIN while simultaneously shifting out the results of the previous test pattern via signal SCANOUT.

It is understood that this procedure can be followed until all test patterns are applied. Thus, the present invention provides an RS scannable latch for use in asynchronous designs that can be easily tested via a scan technique. There are a number of advantages with the above technique and method described above. First, existing scan-based test pattern generators can be readily used. Second, it is possible to run the state machine in a single step operation which is useful for debugging the design. Third, both SET and RESET inputs are sampled. Fourth, the only additional delay imposed on normal operation is a single multiplexer (MUX) delay via MUX 32 or 40. Note however that an additional inverter delay may be required if signals S and R are not generated as easily as signals $\overline{S}$ and $\overline{R}$.

Figure 5:
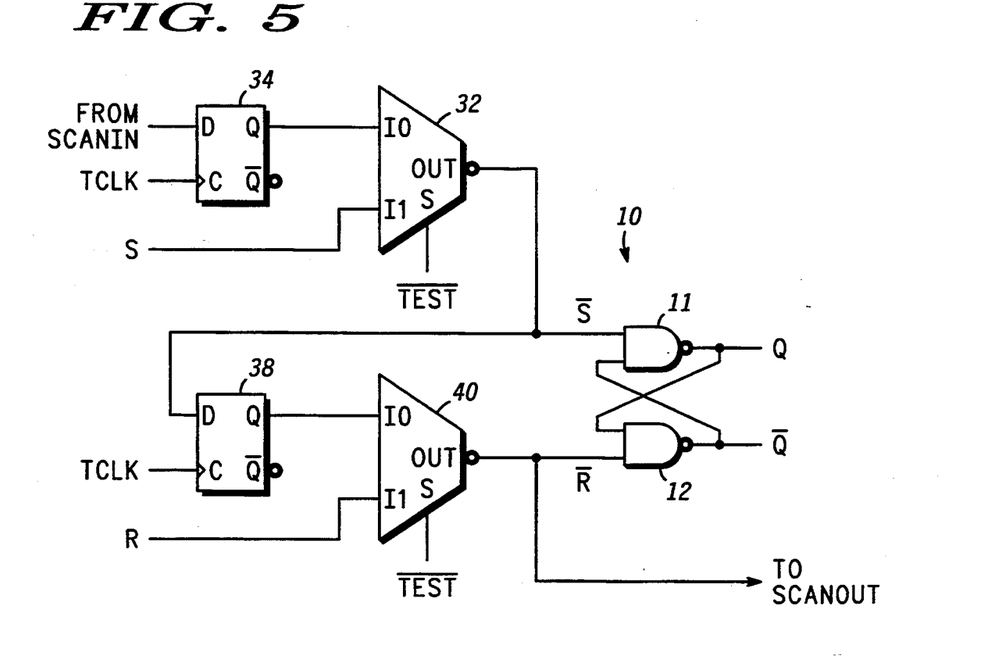
FIG. 5 is a detailed block diagram illustrating a second embodiment of a scannable RS latch in accordance with the present invention.

Referring to FIG. 5, a detailed block diagram of a second embodiment of an RS scannable latch is shown. It is understood that the components shown in FIG. 5 which are identical to components shown in FIG. 4 are identified by the same reference numbers. In essence, the RS scannable latch of FIG. 5 reduces the circuitry shown in FIG. 4 by not including multiplexer 30 and 36. Thus, the RS scannable latch shown in FIG. 5 allows a test pattern to propagate through multiple stages. This may be useful since many stages contain a minimal amount of logic. As a result, this technique should be used in conjunction with the technique shown in FIG. 4.

During normal operation, signal TEST is a logic I and input signals S and R are inverted and applied to RS latch 10. However, when it is desired to test the functionality of RS latch 10, the following scan technique procedure is done.

Set signal TEST to a logic 0. This places flip-flop 32 and 40 into a scan chain.

Now apply clock pulses with signal TCLK thereby shifting in the appropriate values to flip-flops 34 and 38 via signal SCANIN through flip-flop 34, multiplexer 32 and flip-flop 38. Note that utilizing the technique shown in FIG. 5, scanning is no longer done invisibly so that outputs Q and $\overline{Q}$ will be switching while scanning is taking place. When the last pulse on signal TCLK is applied, the test pattern is applied to RS latch 10.

Now set signal TEST to a logic 1. This allows the new S and R signals to propagate to the latch thereby allowing multiple stages to be tested at once.

Now apply a signal clock pulse to signal TCLK. This reads the results of the test pattern thereby allowing the results of the test pattern to be read into the flip-flops 34 and 38 and other similar flip-flops associated with other asynchronous states.

Now set signal TEST to a logic 0. This again places flip-flop 32 and 40 into a scan chain.

Now apply clock pulses via signal TCLK to shift out the contents of flip-flops 34 and 38 thereby observing the results of the test pattern. Note that this procedure is repeated until all test patterns are applied.

Figure 6:
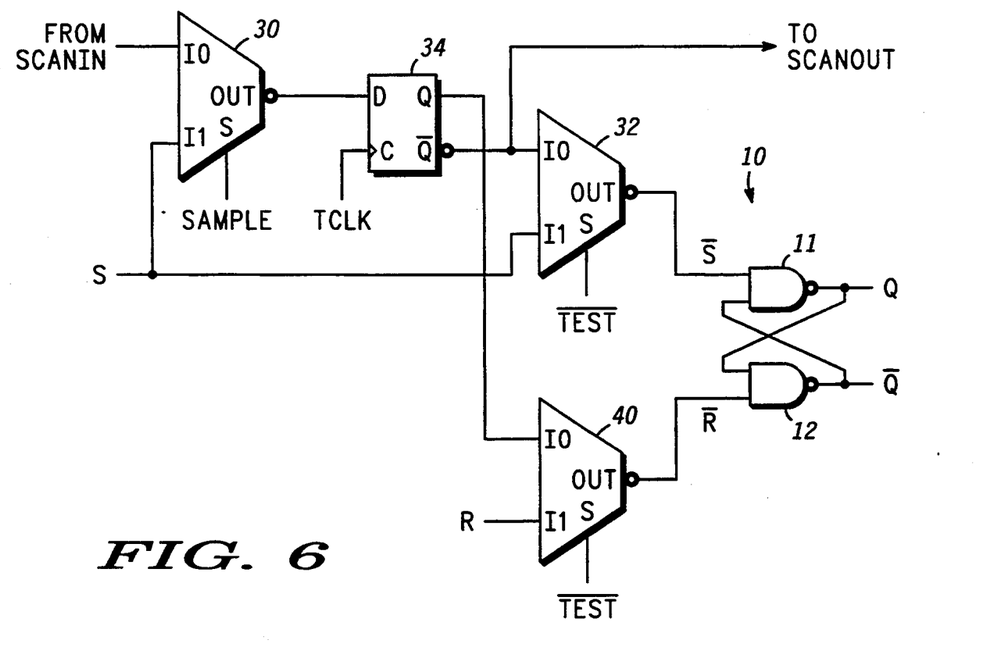
FIG. 6 is a detailed block diagram illustrating a third embodiment of a scannable RS latch in accordance with the present invention.

Referring to FIG. 6, a third embodiment of a scannable RS latch is shown. It is understood that components shown in FIG. 6 which are identical to components shown in FIG. 4 are identified by the same reference numbers. The scan technique shown in FIG. 6 is similar to the technique shown in FIG. 4 with the exception that input signal R is not sampled. As a result, only one flip-flop is required to create the set or reset condition needed to create the test. The loss of coverage of not sampling signal R is minimal in many cases since reset signal R is simply the $\overline{Q}$ output of a subsequent state.

The scan technique procedure for the embodiment shown in FIG. 6 is similar to the aforedescribed scan technique procedure for FIG. 4 with the obvious aforementioned exception that the reset signal is not sampled.

Figure 7:
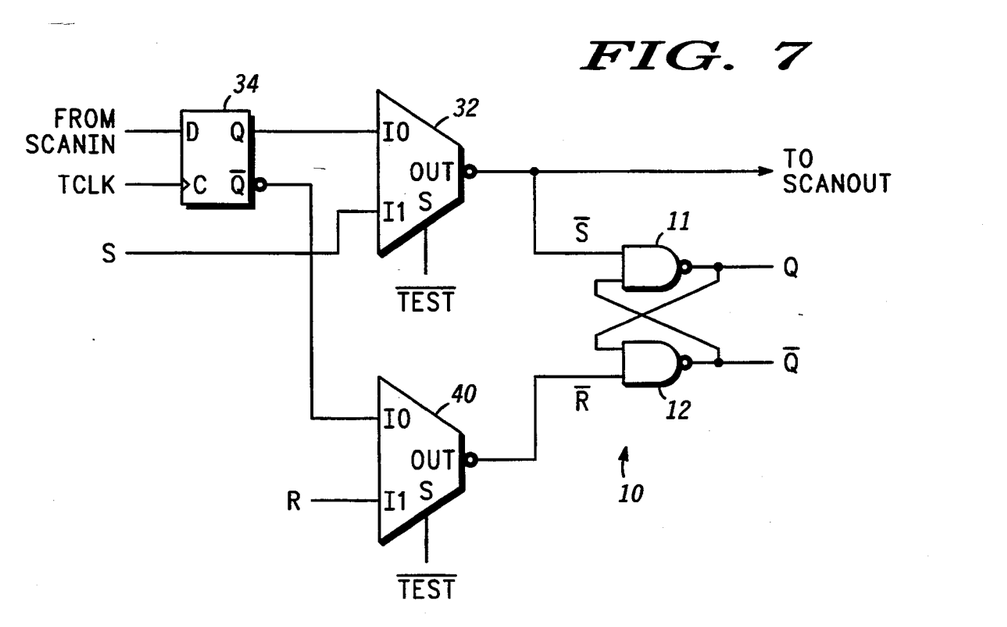
FIG. 7 is a detailed block diagram illustrating a fourth embodiment of a scannable RS latch in accordance with the present invention.

Referring to FIG. 7, a fourth embodiment of a scannable RS latch is shown. It is understood that components shown in FIG. 7 that are identical to components shown in FIG. 5 are identified by the same reference numbers. The scanning technique shown in FIG. 7 is similar to the scanning technique shown in FIG. 5 with the exception that the reset input is not sampled. Thus, as in the case with FIG. 6, only one flip-flop is required to create the set or reset condition needed to create the test.

The scan technique procedure for the embodiment shown in FIG. 7 is similar to the aforedescribed scan technique procedure for FIG. 5 with the obvious exception that steps setting signal SAMPLE to predetermined logic states would be omitted.

A savings in area can be realized by using latches instead of flip-flops in the scan chain. However, such designs would require more care with regard to timing. Also, additional area savings can be realized by incorporating the multiplexers into the flip-flops (or latches).

Figure 8:
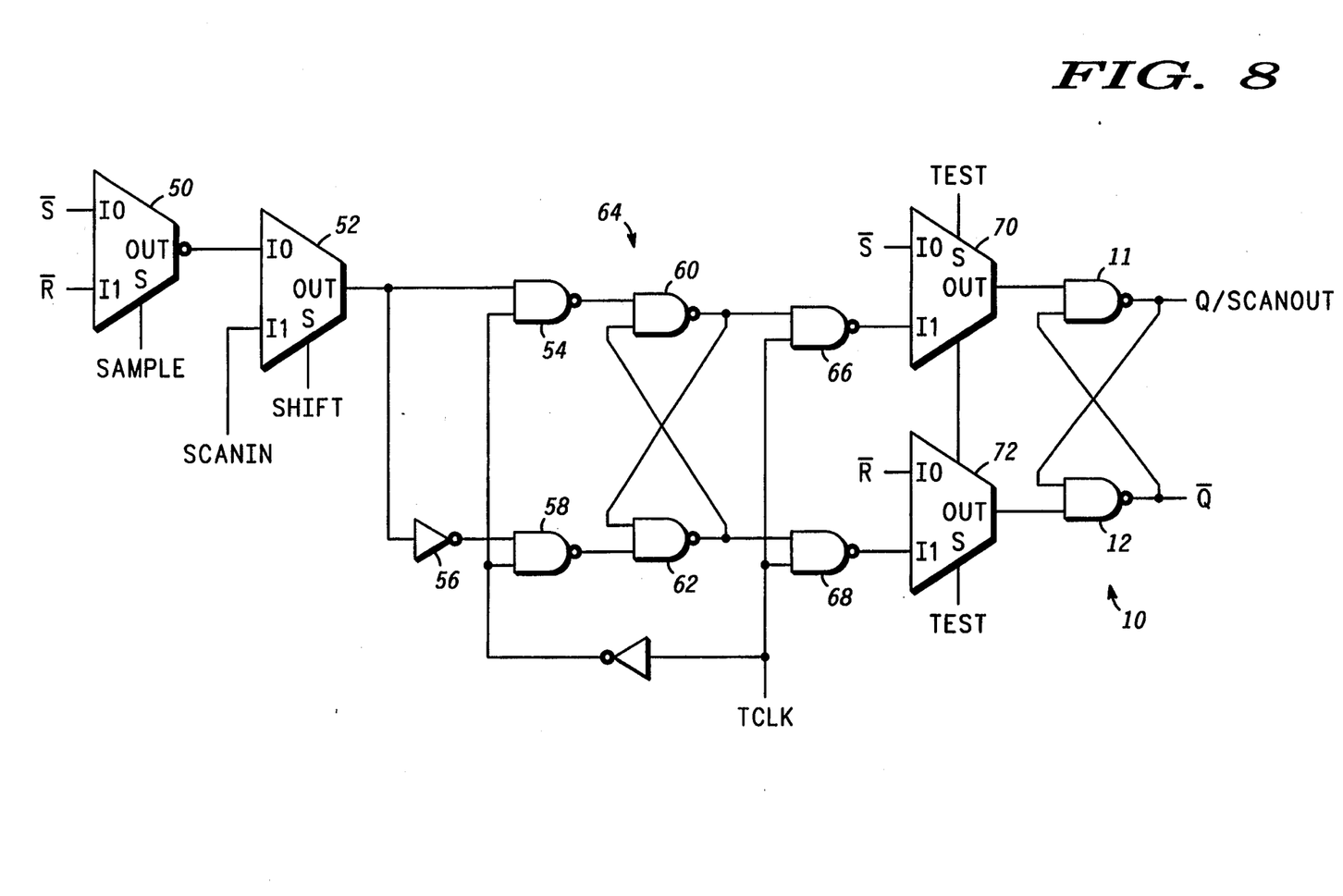
FIG. 8 is a detailed block diagram illustrating a fifth embodiment of a scannable RS latch in accordance with the present invention.

Referring to FIG. 8, a detailed block diagram of a fifth embodiment of a scannable RS latch is shown. In particular, the scannable RS latch shown in FIG. 8 incorporates RS latch 10 into the scan circuitry thereby reducing overall circuitry. The scannable RS latch shown in FIG. 8 includes multiplexer 50 having a first input coupled to receive signal $\overline{S}$ and a second input coupled to receive signal $\overline{R}$. The output of multiplexer 50 is coupled to a first input of multiplexer 52 the latter having a second input coupled to receive signal SCANIN. The select inputs of multiplexers 50 and 52 are respectively coupled to receive control signals SAMPLE and SHIFT.

The output of multiplexer 52 is coupled to a first input of NAND gate 54 and through inverter 56 to a first input of NAND gate 58. The second input of NAND gates 54 and 58 are coupled to receive test clock signal TCLK.

The outputs of NAND gates 54 and 58 are respectfully coupled to the first inputs of NAND gates 60 and 62 wherein NAND gates 60 and 62 comprise an RS latch as denoted by reference number 64. The second inputs of NAND gates 60 and 62 are respectively cross-coupled to the outputs of NAND gates 62 and 60. It is worth noting that gates 54, 56, 58, 60 and 62 comprise a first D-latch.

The outputs of NAND gates 60 and 62 are respectively coupled to the first inputs of NAND gates 66 and 68. The second inputs of NAND gates 66 and 68 are coupled to receive test clock signal TCLK.

The outputs of NAND gates 66 and 68 are respectively coupled to a second input of multiplexers 70 and 72. The first inputs of multiplexers 70 and 72 are respectively coupled to receive signals $\overline{S}$ and $\overline{R}$. The outputs of multiplexers 70 and 72 are respectively coupled to the first inputs of NAND gates 11 and 12 of RS latch 10. Also, the select inputs of multiplexers 70 and 72 are responsive to control signal TEST.

It is worth noting that gates 66, 68, 11 and 12 comprise a second D-latch. Moreover, it is worth noting that components 54, 58, 60, and 62 (the first D-latch) form a master section of a flip-flop while components 66, 68, and latch 10 (the second D-latch) form a slave section of a flip-flop. Thus, in this manner, RS latch 10 is utilized and incorporated to form a flip-flop in the overall scannable RS latch.

In normal mode operation, signal TEST is a logic 0 and multiplexers 70 and 72 function to pass signals $\overline{S}$ and $\overline{R}$ to RS latch 10. Further, signal TCLK is a logic 0 thereby not allowing RS latch 64 to switch.

In test mode operation, that is, when it is desired to scan in predetermined logic values at the input of RS latch 10 via signal SCANIN, signal TEST is a logic 1 and signal SHIFT is a logic 1. Thus, when signal TCLK is a logic 1, NAND gates 54 and 58 pass the logic values appearing at their first inputs to the first inputs of RS latch 64 thereby functioning to set or reset RS latch 64. For example, if signal SCANIN is a logic 0, then a logic 0 will be applied at the first input of NAND gate 54 while logic 1 will be applied at the first input of NAND gate 58. As a result, the output of NAND gate 60 will be a logic 0 while the output of NAND gate 62 will be a logic 1. In essence, the logic value appearing on signal SCANIN has the effect of either setting or resetting RS latch 64 thereby latching predetermined logic values at the outputs of NAND gates 60 and 62 when signal TCLK transitions from logic 1 to logic 0 and, correspondingly, signal $\overline{TCLK}$ transitions from logic 0 to logic 1.

However, when signal TCLK is a logic 0 and signal $\overline{TCLK}$ is a corresponding logic 1, NAND gate 66 and 68 essentially invert the logic value appearing at each of its first inputs and respectively provide these logic values to the first inputs of NAND gates 11 and 12 of RS latch 10. Continuing with the above example, the logic 0 appearing at the output of NAND gate 60 passes through NAND gate 66 and multiplexer 70 thereby providing a logic high at the first input of NAND gate 11. Moreover, the logic 1 appearing at the output of NAND gate 62 passes through NAND gate 68 and multiplexer 70 thereby, applying a logic 0 at the first input of NAND gate 12. These logic values applied at the inputs of RS latch 10 resets RS latch 10 whereby signal Q is a logic 0 and signal $\overline{Q}$ is a logic 1. Thus, since a logic 0 appeared at signal SCANIN, the proper operation of RS latch 10 means that RS latch 10 should be reset. Further, because of the construction of the scannable RS latch of FIG. 8, the output of NAND gate 11 provides signal Q (which is coupled to the $\overline{S}$ input of a similar succeeding scannable RS latch) as well as signal SCANOUT.

Figure 9:
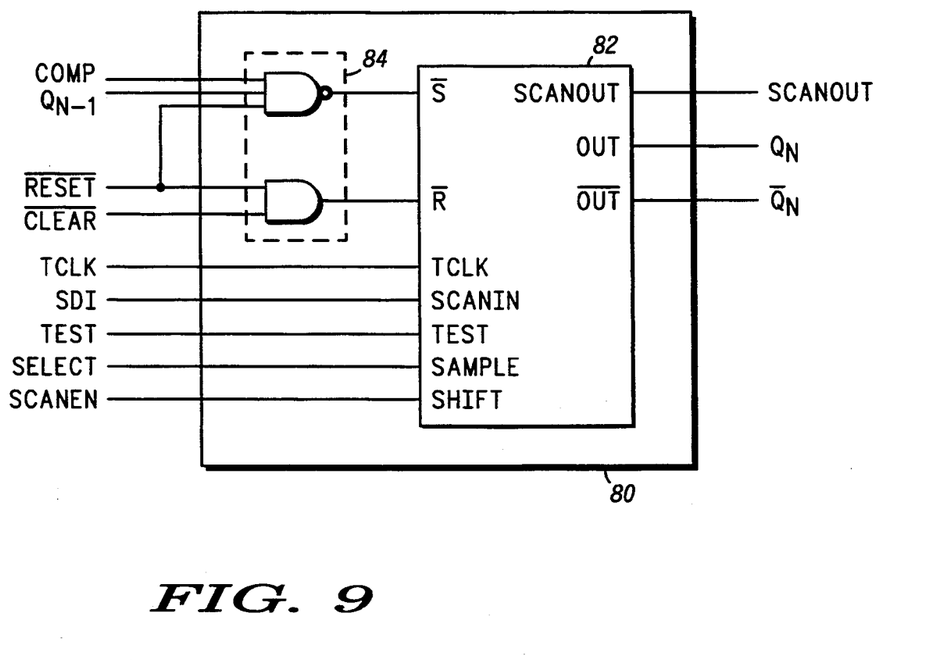
FIG. 9 is a block diagram illustrating an asynchronous application of a scanable RS latch cell.

Referring to FIG. 9, scannable RS latch cell 82 has an $\overline{S}$ input coupled to the output of a single NAND gate, and an $\overline{R}$ input coupled to an output of a single AND gate. The single NAND gate and the single AND gate form logic front-end 84 for scannable asynchronous cell 80. Scannable RS latch cell 82 includes outputs SCANOUT, OUT, and $\overline{OUT}$ coupled to outputs SCANOUT, QN, and $\overline{Q}_N$ of scannable asynchronous cell 80, respectively. Scannable RS latch cell 82 includes scan test inputs TCLK, SCANIN, TEST, SAMPLE, and SHIFT coupled to inputs TCLK, SDI, TEST, SELECT, and SCANEN of scannable asynchronous cell 80, respectively. Single NAND gate has first, second, and third inputs coupled to COMP, $Q_{N-1}$, and RESET inputs of scannable asynchronous cell 80, respectively. Single AND gate has first and second inputs coupled to RESET and CLEAR inputs of scannable asynchronous cell 80, respectively.

In FIG. 9, logic front-end 84 is derived from the non-scan testable asynchronous design building block 14. Scannable RS latch cell 82 is the cell previously described in FIG. 8. Thus, by using the features of asynchronous scan based testing of the present invention, a scannable asynchronous cell 80 can be implemented.

By now it should be apparent from the foregoing discussion that a novel RS latch for use in asynchronous designs has been provided. The RS latch is made scannable by the use of additional circuitry which provides a basis for a scan chain signal to propagate in and out of the scannable RS latch. Such a scannable RS latch greatly facilitates the testing of the asynchronous design.

The present invention additionally provides a method for making an RS latch scannable, the RS latch having first and second inputs and first and second outputs, the method comprising the steps of (a) sampling RESET and SET signals, (b) selecting either the RESET, the SET or a SCANIN signal; (c) storing the selected signal from step (b) in response to a clock signal; (d) selectively applying the stored signal from step (c) or the SET and RESET signal to the first and second inputs of the RS latch in response to said clock signal; (e) providing a SCANOUT signal via the first output of the RS latch.

While the invention has been described in specific embodiments thereof, it is evident that many alterations, modifications and variations will be apparent to those skilled in the art. Further, it is intended to embrace all such alterations, modifications and variations in the appended claims.

We claim:

1. A scannable RS latch for use in asynchronous designs, the scannable RS latch having inputs being responsive to $\overline{SET}$ and $\overline{RESET}$ signals and first and second outputs for providing first and second complementary output signals, comprising:

first multiplexer means being responsive to a first set of control signals for selectively passing signal $\overline{SET}$ and signal $\overline{RESET}$, or signal SCANIN to an output of said first multiplexer means;

first latch means being responsive to a clock signal for storing a logic value of a signal appearing at said output of said first multiplexer means, said first latch means having first and second inputs and first and second outputs, said first and second inputs of said first latch means coupled to said output of said first multiplexer means;

second latch means being responsive to said clock signal for storing logic values of signals appearing at said first and second outputs of said first latch means, said second latch means having first and second inputs and first and second outputs, said first and second inputs of said second latch means coupled to said first and second outputs of said first latch means, said first and second outputs of said second latch means for providing the first and second complementary output signals, said first output of said second latch means for providing a SCANOUT signal.

2. The scannable RS latch according to claim 1 further including second multiplexer means within said second latch means for alternately placing the scannable RS latch in a normal mode operation and a test mode operation.

3. The scannable RS latch according to claim 1 wherein said first multiplexer means includes:

a first multiplexer having first and second inputs, a select input and an output, said first input of said first multiplexer coupled for receiving the $\overline{\text{SET}}$ signal, said second input coupled for receiving the $\overline{\text{RESET}}$ signal, said select input of said first multiplexer coupled for receiving a sample signal; and a second multiplexer having first and second inputs, a select input and an output, said first input of said second multiplexer coupled to said output of said first multiplexer, said second input of said second multiplexer coupled for receiving said SCANIN signal, said select input of said second multiplexer coupled for receiving a shift signal, said output of said second multiplexer coupled to said first latch means.

4. The scannable RS latch according to claim 1 wherein said first latch means includes:

logic means being responsive to said clock signal for passing said logic value appearing at said output of said first multiplexer means, said logic means having first and second outputs for providing complementary logic values thereat; and a first RS latch having first and second inputs and first and second outputs, said first and second inputs of said first RS latch coupled to said first and second outputs of said logic means, said first and second outputs of said RS latch respectively coupled to said first and second inputs of said second latch means.

5. The scannable RS latch according to claim 2 wherein said second latch means includes:

logic means being responsive to said clock signal for passing said logic values appearing at said output of said first multiplexer means, said logic means having first and second outputs for providing complementary logic values thereat; and a first RS latch having first and second inputs and first and second outputs, said first and second inputs of said first RS latch coupled to said first and second outputs of said logic means, said first and second outputs of said RS latch respectively coupled for providing the first and second complementary output signals.

6. The scannable RS latch according to claim 5 wherein said second multiplexer means includes:

a first multiplexer having first and second inputs, a select input and an output, said first input of said first multiplexer coupled for receiving the $\overline{\text{SET}}$ signal, said second input coupled to said first output of said logic means of said second latch means, said select input of said first multiplexer coupled for receiving a test control signal, said output of said first multiplexer coupled to said first input of said RS latch of said second latch means; and a second multiplexer having first and second inputs, a select input and an output, said first input of said second multiplexer coupled for receiving the $\overline{\text{RESET}}$ signal, said second input of said second multiplexer coupled to said second output of said logic means of said second latch means, said select input of said second multiplexer coupled for receiving said test control signal, said output of said second multiplexer coupled to said second input of said RS latch of said second latch means.

7. A circuit for use with an RS latch for making the RS latch scannable, the RS latch having first and second inputs and first and second outputs, the circuit comprising:

first multiplexer means responsive to a TEST signal for selectively passing a SET and a RESET signal to said first and second inputs of the RS latch or a SCANIN signal to the first and second inputs of the RS latch;

second multiplexer means responsive to a sample signal for sampling the SET signal, said second multiplexer means having first and second inputs, a select input and an output, said first input of said second multiplexer means coupled to receive a SCANIN signal, said second input of said second multiplexer means coupled to receive the SET signal, said select input of said second multiplexer means coupled to receive said sample signal; and a first flipflop having a data input, a clock input and first and second outputs, said data input of said first flipflop coupled to said output of said second multiplexer means, said clock input coupled to receive a clock signal, said first and second outputs of said first flipflop coupled for providing said SCANIN signal to said first multiplexer means, said second output of said first flipflop providing a SCANOUT signal.

8. A circuit for use with an RS latch for making the RS latch scannable, the RS latch having first and second inputs and first and second outputs, the circuit comprising:

first multiplexer means responsive to a TEST signal for selectively passing a SET and a RESET signal to said first and second inputs of the RS latch or a SCANIN signal to the first and second inputs of the RS latch;

second multiplexer means responsive to a sample signal for sampling the SET signal, said second multiplexer means having first and second inputs, a select input and an output, said first input of said second multiplexer means coupled to receive a SCANIN signal, said second input of said second multiplexer means coupled to receive the SET signal, said select input of said second multiplexer means coupled to receive said sample signal;

a first flipflop having a data input, a clock input and a first output, said data input of said first flipflop coupled to said output of said third multiplexer means, said clock input coupled to receive a clock signal, said first output of said first flipflop coupled for providing said SCANIN signal to said first multiplexer means;

third multiplexer means responsive to said sample signal for sampling the RESET signal, said third multiplexer means having first and second inputs, a select input and an output, said first input of said third multiplexer means coupled to said first output of said first flip for receiving said SCANIN signal, said second input of said second multiplexer means coupled to receive the RESET signal, said select input of said second multiplexer means coupled to receive said sample signal; and a second flipflop having a data input, a clock input and a first output, said data input of said second flipflop coupled to said output of said third multiplexer means, said clock input coupled to receive said clock signal, said first output of said second flipflop coupled for providing said SCANIN signal to said first multiplexer means, said first output of said second flipflop providing a SCANOUT signal.

9. A circuit for use with an RS latch for making the RS latch scannable, the RS latch having first and second inputs and first and second outputs, the circuit comprising:

first multiplexer means responsive to a TEST signal for selectively passing a SET and a RESET signal to said first and second inputs of the RS latch or a SCANIN signal to the first and second inputs of the RS latch, an output of said first multiplexer means for providing a SCANOUT signal;

a first flipflop having a data input, a clock input and a first output, said data input of said first flipflop coupled for receiving said SCANIN signal, said clock input coupled to receive a clock signal, said first output of said first flipflop coupled for providing said SCANIN signal to said first multiplexer means; and a second flipflop having a data input, a clock input and a first output, said data input of said second flipflop coupled to said first output of said first flipflop for receiving said SCANIN signal, said clock input coupled to receive said clock signal, said first output of said second flipflop coupled for providing said SCANIN signal and an inverted SCANIN signal to said first multiplexer means.

10. A method of scanning an RS latch, the RS latch having first and second inputs and first and second outputs, the method comprising steps of:
 (a) selecting either a RESET and a SET, or a SCANIN signal;
 (b) storing said selected signal from step (a) in response to a clock signal;
 (c) selectively applying said stored signal from step (b) or said SET and RESET signal to the first and second inputs of the RS latch in response to said clock signal; and
 (d) providing a SCANOUT signal via the first output of the RS latch.

11. The method of scanning an RS latch according to claim 10 further including a step of sampling said RESET and SET signals.

12. A circuit for use with an RS latch for making the RS latch scannable, the RS latch having first and second inputs and first and second outputs, the circuit comprising:

a first flipflop having a data input, a clock input and first and second complementary outputs, said data input being coupled for receiving a SCANIN signal, said clock input being coupled for receiving a clock signal, said first output passing said SCANIN signal, said second output providing an inverted SCANIN signal; and multiplexer means coupled for receiving a SET and a RESET signal at first and second inputs and passing said SET and RESET signals to first and second outputs in response to a first state of a TEST signal, said first and second outputs of said multiplexer means being respectively coupled to the first and second inputs of the RS latch, said multiplexer means further being coupled for receiving said SCANIN signal and said inverted SCANIN signal at third and fourth inputs and passing said SCANIN signal and said inverted SCANIN signal to said first and second outputs in response to a second state of said TEST signal, said first output of said multiplexer means providing a SCANOUT signal.

* * * * *